US012566294B2

(12) United States Patent
Tsurugaya et al.

(10) Patent No.: US 12,566,294 B2
(45) Date of Patent: Mar. 3, 2026

(54) OPTICAL DEVICE

(71) Applicant: NTT, Inc., Tokyo (JP)

(72) Inventors: Takuma Tsurugaya, Tokyo (JP); Shinji Matsuo, Tokyo (JP); Koji Takeda, Tokyo (JP); Takuro Fujii, Tokyo (JP)

(73) Assignee: NTT, INC., Tokyo (JP)

( * ) Notice: Subject to any disclaimer, the term of this patent is extended or adjusted under 35 U.S.C. 154(b) by 847 days.

(21) Appl. No.: 17/910,188

(22) PCT Filed: Mar. 23, 2020

(86) PCT No.: PCT/JP2020/012661
§ 371 (c)(1),
(2) Date: Sep. 8, 2022

(87) PCT Pub. No.: WO2021/191954
PCT Pub. Date: Sep. 30, 2021

(65) Prior Publication Data
US 2023/0115502 A1     Apr. 13, 2023

(51) Int. Cl.
*H01S 5/14*     (2006.01)
*G02B 6/125*     (2006.01)
*H01S 3/08*     (2023.01)

(52) U.S. Cl.
CPC ................ *G02B 6/125* (2013.01); *H01S 3/08* (2013.01); *H01S 5/14* (2013.01)

(58) Field of Classification Search
CPC .... G02B 6/1223–1225; G02B 6/12007; G02B 6/125
See application file for complete search history.

(56) References Cited

U.S. PATENT DOCUMENTS 6,813,419 B2 * 11/2004 Matsushima ........ G02B 6/1228
                                           385/124
7,603,016 B1 * 10/2009 Soref ..................... B82Y 20/00
                                           385/129

(Continued)

FOREIGN PATENT DOCUMENTS

JP       2005005502 A      1/2005
JP       2014202788 A    10/2014

(Continued)

OTHER PUBLICATIONS

Zain et al. "Design and Fabrication of High Quality-Factor 1-D Photonic Crystal/Photonic Wire Extended Microcavities," IEEE Photonics Technology Letters, vol. 22, No. 9, May 1, 2010, 3 pages.

*Primary Examiner* — Minsun O Harvey
*Assistant Examiner* — Fernanda Adriana Camacho Alanis
(74) *Attorney, Agent, or Firm* — Slater Matsil, LLP

(57)         ABSTRACT

A difference Δ1 between an equivalent refractive index of a first reflecting section and an equivalent refractive index of a core in a first region that corresponds to the first reflecting section and a difference between an equivalent refractive index of a second reflecting section and an equivalent refractive index of the core in a second region that corresponds to the second reflecting section is set so as to be greater than a difference between an equivalent refractive index of a confining section and an equivalent refractive index of the core in a third region that corresponds to the confining section.

20 Claims, 11 Drawing Sheets

(56)  References Cited

U.S. PATENT DOCUMENTS

| | | | | |
|---|---|---|---|---|
| 8,705,583 B2 * | 4/2014 | Matsuda | ............. | H01S 5/06258 |
| | | | | 372/50.11 |
| 2011/0188530 A1 * | 8/2011 | Lell | ...................... | H01S 5/1017 |
| | | | | 372/49.01 |
| 2015/0212266 A1 * | 7/2015 | Czornomaz | .......... | G02B 6/1225 |
| | | | | 438/31 |
| 2016/0156147 A1 | 6/2016 | Raino et al. | | |

FOREIGN PATENT DOCUMENTS

| | | | |
|---|---|---|---|
| JP | 2015078866 A | 4/2015 | |
| JP | 2019035855 A | 3/2019 | |

* cited by examiner

FIG. 7A

OPTICAL DEVICE

CROSS-REFERENCE TO RELATED APPLICATIONS

This application is a national phase entry of PCT Application No. PCT/JP2020/012661, filed on Mar. 23, 2020, which application is hereby incorporated herein by reference.

TECHNICAL FIELD

The present invention relates to an optical device using a thin-wire waveguide-type one-dimensional photonic crystal.

BACKGROUND

An optical waveguide made of a thin-wire waveguide-type photonic crystal with periodically formed holes in a one-dimensional configuration (a one-dimensional photonic crystal) enables strong optical confinement into an extremely small region in the scale of μm. It is anticipated that this optical waveguide structure will be applied to ultrasmall laser diodes, photodiodes, and the like which operate with extremely low power. For example, a Fabry-Perot resonator which comprises a one-dimensional photonic crystal as reflecting section and in which a confining section is sandwiched between two reflecting sections has been studied and developed (refer to NPL 1). This technique enables optical confinement to be performed into a region in the scale of several μm which is sandwiched between two reflecting sections each made of a one-dimensional photonic crystal and enables an optical resonator which is minute (in the scale of several μm) and which has a high Q factor (a Q factor reaching the order of 104) to be realized.

CITATION LIST

Non Patent Literature

[NPL 1] Ahmad Rifqi Md Zain et al., "Design and Fabrication of High Quality-Factor 1-D Photonic Crystal/ Photonic Wire Extended Microcavities", IEEE Photonics Technology Letters, vol. 22, no. 9, pp. 610-612, 2010.

SUMMARY

Technical Problem

When constructing a semiconductor laser or the like using a resonator in which the one-dimensional photonic crystal described above is used as a reflecting section, an optical waveguide or the like for light extraction is to be coupled to the resonator. To this end, a configuration is conceivably adopted in which, for example, a core made of silicon (an Si Core) is arranged in a vicinity of a resonator and an optical waveguide constituted of the Si core and the resonator are optically coupled to each other. This is a configuration in which the resonator is coupled as a notch filter to the optical waveguide and, in addition to the semiconductor laser described above, the configuration can be applied to an optical filter, a semiconductor light-receiving element that absorbs light of a resonator wavelength, or the like.

However, when a resonator that uses a one-dimensional photonic crystal as a reflecting section and an optical waveguide that is provided nearby are strongly coupled to each other, reflection characteristics decline significantly and resonator characteristics decline (a Q factor drops). On the other hand, this structure requires strong optical coupling between the resonator and the optical waveguide. Therefore, the resonator must be strongly coupled to the optical waveguide without causing a decline in resonance characteristics of the resonator. In order to do so, a configuration must be realized in which the optical waveguide is coupled to a region (a confining section) between two reflecting sections but not coupled to the reflecting sections.

However, the confining section of a resonator that uses a one-dimensional photonic crystal as a reflecting section is extremely short with a length of around several μm. Therefore, it is difficult to realize the configuration described above by, for example, bending the optical waveguide. In this case, the optical waveguide is to be bent at an extremely small radius of curvature and radiation loss or the like becomes prominent. Therefore, since the optical waveguide is inevitably arranged in a state in which the optical waveguide conforms to the resonator without being bent, a state is created in which the optical waveguide is also coupled to the reflecting sections and, consequently, a decline in resonance characteristics of the resonator cannot be prevented.

Embodiments of the present invention have been made in order to solve the problem described above and an object thereof is to enable a resonator using a thin-wire waveguide-type one-dimensional photonic crystal as a reflecting section and an optical waveguide to be optically coupled to each other without degrading resonance characteristics.

Means for Solving the Problem

An optical device according to embodiments of the present invention includes: a first reflecting section constituted of a thin-wire waveguide-type one-dimensional photonic crystal; a second reflecting section constituted of a thin-wire waveguide-type one-dimensional photonic crystal; a confining section sandwiched between the first reflecting section and the second reflecting section; and a core that is arranged along the first reflecting section, the confining section, and the second reflecting section, wherein a Fabry-Perot optical resonator is constituted by the first reflecting section, the confining section, and the second reflecting section, a distance between the core and the confining section is set within a range that allows optical coupling to each other, and at least one of a difference between an equivalent refractive index of the first reflecting section and an equivalent refractive index of the core in a first region that corresponds to the first reflecting section and a difference between an equivalent refractive index of the second reflecting section and an equivalent refractive index of the core in a second region that corresponds to the second reflecting section is greater than a difference between an equivalent refractive index of the confining section and an equivalent refractive index of the core in a third region that corresponds to the confining section.

Effects of Embodiments of the Invention

As described above, according to embodiments of the present invention, since a difference in equivalent refractive indexes between a reflecting section which constitutes a resonator and a core is made greater than a difference in equivalent refractive indexes between a confining section and the core, a resonator using a one-dimensional photonic crystal as a reflecting section and an optical waveguide can be optically coupled to each other without degrading resonance characteristics.

BRIEF DESCRIPTION OF THE DRAWINGS

FIG. 7A is a characteristic diagram showing a result of a calculation of reflection characteristics of an optical resonator in a conventional optical device that combines the optical resonator and an optical waveguide with each other.

DETAILED DESCRIPTION OF ILLUSTRATIVE EMBODIMENTS

Figure 1:
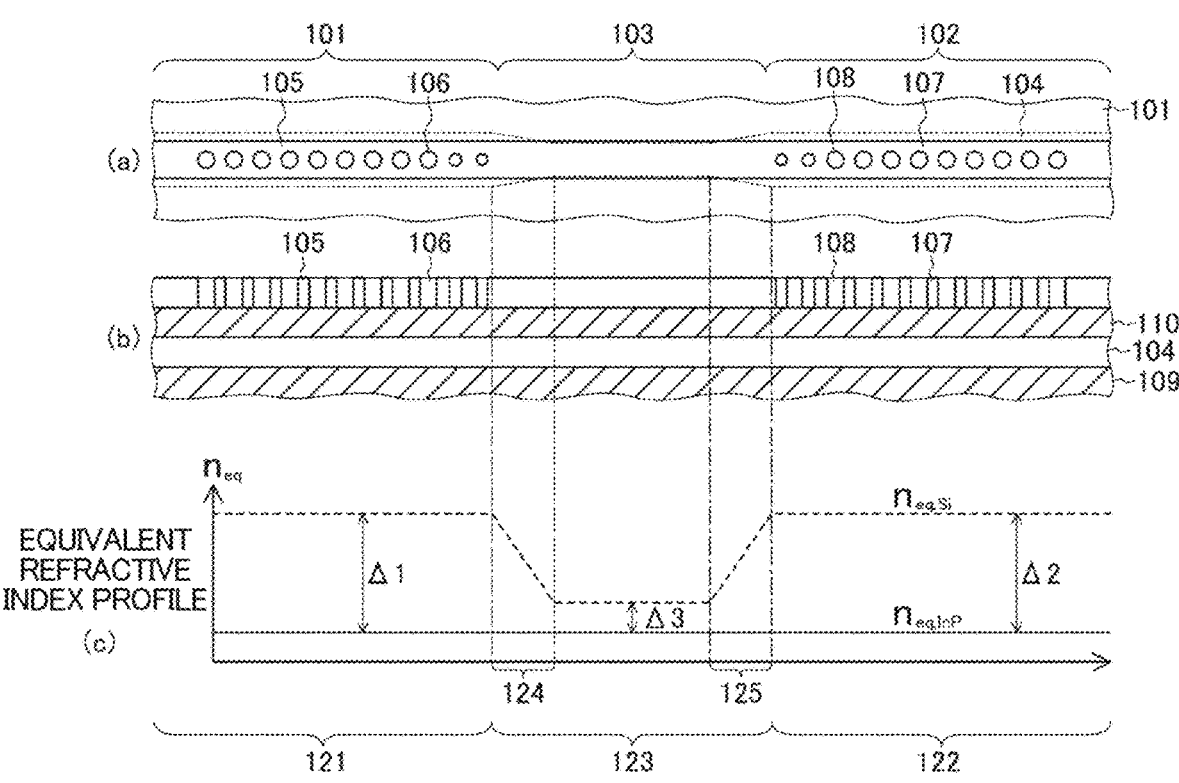
In FIG. 1, (a) is a plan view showing a configuration of an optical device according to a first embodiment of the present invention, (b) is a sectional view thereof, and (c) is a characteristic diagram showing an equivalent refractive index profile of each part thereof.

Hereinafter, optical devices according to embodiments of the present invention will be described.

First Embodiment

First, an optical device according to a first embodiment of the present invention will be described with reference to FIG. 1. The optical device first includes: a first reflecting section 101 constituted of a thin-wire waveguide-type one-dimensional photonic crystal; a second reflecting section 102 constituted of a thin-wire waveguide-type one-dimensional photonic crystal; and a confining section 103 sandwiched between the first reflecting section 101 and the second reflecting section 102.

The thin-wire waveguide-type photonic crystal (a one-dimensional photonic crystal) constituting the first reflecting section 101 includes a first base 105 and a first lattice element 106 formed in the first base 105. The first lattice element 106 is linearly and periodically provided at predetermined intervals, has a refractive index which differs from that of the first base 105, and has a columnar (for example, a cylindrical) shape. For example, the first lattice element 106 is a through-hole formed in the first base 105.

The one-dimensional photonic crystal constituting the second reflecting section 102 includes a second base 107 and a second lattice element 108 formed in the second base 107. The second lattice element 108 is linearly and periodically provided at predetermined intervals, has a refractive index which differs from that of the second base 107, and has a columnar (for example, a cylindrical) shape. For example, the second lattice element 108 is a through-hole formed in the second base 107.

The confining section 103 is arranged so as to be sandwiched between the first reflecting section 101 and the second reflecting section 102. A Fabry-Perot optical resonator is constituted by the first reflecting section 101, the confining section 103, and the second reflecting section 102. For example, the first base 105, the confining section 103, and the second base 107 are integrally formed of a same material, in which case the confining section 103 is a portion where a lattice element is not formed.

The first base 105, the confining section 103, and the second base 107 can be constituted of, for example, InP. An integrated structure constituting the first base 105, the confining section 103, and the second base 107 can be, for example, a core-like structure with a width of 500 nm and a thickness of 250 nm.

In addition, for example, when a resonance wavelength is set to a 1.55 µm band which is suitable for communication applications, lattice constants of the first reflecting section 101 and the second reflecting section 102 can be set to around 375 nm to 455 nm. Furthermore, diameters of the first lattice element 106 and the second lattice element 108 can be set to 180 nm. Since the first base 105, the confining section 103, and the second base 107 are given a core shape with a thickness of 250 nm, the first lattice element 106 and the second lattice element 108 form a cylinder with a diameter of 180 nm and a height of 250 nmn.

In addition, the optical device according to the first embodiment includes an optical waveguide constituted of a core 104 that is arranged along the first reflecting section 101, the confining section 103, and the second reflecting section 102. For example, the core 104 is made of silicon. The core 104 is formed on a lower clad layer 109. In addition, an upper clad layer 110 is formed on the lower clad layer 109 so as to cover the core 104. For example, each clad layer is made of silicon oxide. In the embodiment, an optical resonator constituted of the first base 105, the confining section 103, and the second base 107 described above is formed on the upper clad layer 110. It should be noted that (a) in FIG. 1 is a plan view and (b) in FIG. 1 is a sectional view in a stack direction of the optical waveguide and the optical resonator.

In the embodiment, each of the first reflecting section 101, the confining section 103, and the second reflecting section 102 and the core 104 are separated from each other by the upper clad layer 110. In addition, distances between each of the first reflecting section 101, the confining section 103, and the second reflecting section 102 and the core 104 are set within a range that allows optical coupling to each other.

In addition, in the optical device according to the embodiment, at least one of a difference Δ1 between an equivalent refractive index of the first reflecting section 101 and an equivalent refractive index of the core 104 in a first region 121 that corresponds to the first reflecting section 101 and a difference Δ2 between an equivalent refractive index of the second reflecting section 102 and an equivalent refractive index of the core 104 in a second region 122 that corresponds to the second reflecting section 102 is set so as to be greater than a difference Δ3 between an equivalent refractive index of the confining section 103 and an equivalent refractive index of the core 104 in a third region 123 that corresponds to the confining section 103.

Adopting the configuration described above enables a configuration to be realized in which the optical waveguide constituted of the core 104 and the confining section 103 are optically coupled to each other but the first and second reflecting sections 101 and 102 and the optical waveguide constituted of the core 104 are not optically coupled to each other.

For example, the relationship between differences in equivalent refractive indexes described above can be satisfied by differentiating a diameter of the core 104 in the third region 123 from that of at least one of the core 104 in the first region 121 and the core 104 in the second region 122 [(c) in FIG. 1].

In the first embodiment, by making the diameter of the core 104 in the third region 123 narrower than the diameters of the core 104 in the first region 121 and the core 104 in the second region 122, both Δ1 and Δ2 are made larger than Δ3. In the first embodiment, a width of the core 104 is made wider than widths of the first reflecting section 101 and the second reflecting section 102 in a plan view and, consequently an optical resonator constituted of the first reflecting section 101, the confining section 103, and the second reflecting section 102 has a greater equivalent refractive index than that of the optical waveguide constituted of the core 104.

As described above, controlling the diameter of the core 104 enables the optical resonator and the core 104 (the optical waveguide) to be optically coupled to each other at an arbitrary strength while maintaining optical separateness between the optical waveguide and the first and second reflecting sections 101 and 102.

In addition, the core 104 can also be configured so that the diameter thereof is gradually varied from the third region 123 to at least one of the first region 121 and the second region 122. In the first embodiment, a first adiabatic region 124 in which the diameter of the core 104 gradually widens from the third region 123 to the first region 121 and a second adiabatic region 125 in which the diameter of the core 104 gradually widens from the third region 123 to the second region 122 are provided.

Adopting such a configuration enables a strength of the optical coupling between the core 104 and the optical resonator to be gradually (adiabatically) varied. Shapes of modes differ between the first and second reflecting sections 101 and 102 and the confining section 103 and, generally, radiation loss due to a mode mismatch between the first and second reflecting sections 101 and 102 and the confining section 103 can be present. Conversely, by imparting an adiabatic change in shape as described above, a configuration in which modes are adiabatically converted can be adopted and a reduction in radiation loss due to a mode mismatch can be achieved.

In addition, for example, by including a light-emitting unit such as a light-emitting diode constituted of a semiconductor in the confining section 103, the optical device described above can be made into a semiconductor laser. The light-emitting diode can be constituted of an active layer arranged in the confining section 103 and a current injection structure connected to the confining section 103.

Second Embodiment

Next, an optical device according to a second embodiment of the present invention will be described with reference to FIG. 2. The optical device first includes: a first reflecting section 101 constituted of a thin-wire waveguide-type one-dimensional photonic crystal; a second reflecting section 102 constituted of a thin-wire waveguide-type one-dimensional photonic crystal; and a confining section 103 sandwiched between the first reflecting section 101 and the second reflecting section 102. These components are similar to those in the first embodiment described earlier.

The optical device according to the second embodiment includes an optical waveguide constituted of a core 104a that is arranged along the first reflecting section 101, the confining section 103, and the second reflecting section 102. The core 104a is formed on a lower clad layer 109a. In addition, an upper clad layer 110a is formed on the lower clad layer 109a so as to cover the core 104a. In the embodiment, an optical resonator constituted of the first base 105, the confining section 103, and the second base 107 described above is formed on the upper clad layer 110a. It should be noted that (a) in FIG. 2 is a plan view and (b) in FIG. 2 is a sectional view in a stack direction of the optical waveguide and the optical resonator.

In the second embodiment, each of the first reflecting section 101 and the confining section 103 and the core 104a are separated from each other by the upper clad layer 110a. In addition, distances between each of the first reflecting section 101 and the confining section 103 and the core 104a are set within a range that allows optical coupling to each other. In the second embodiment, the core 104a is formed from a side of the first reflecting section 101 to the middle of the confining section 103. In the second embodiment, the core 104a is severed at the middle of the confining section 103.

In the second embodiment, a difference Δ1 between an equivalent refractive index of the first reflecting section 101 and an equivalent refractive index of the core 104a in a first region 121 that corresponds to the first reflecting section 101 is set so as to be greater than a difference Δ3 between an equivalent refractive index of the confining section 103 and an equivalent refractive index of the core 104a in a third region 123 that corresponds to the confining section 103. Adopting this configuration enables a configuration to be realized in which the optical waveguide constituted of the core 104a and the confining section 103 are optically coupled to each other but the first reflecting section 101 and the optical waveguide constituted of the core 104a are not optically coupled to each other.

Figure 2:
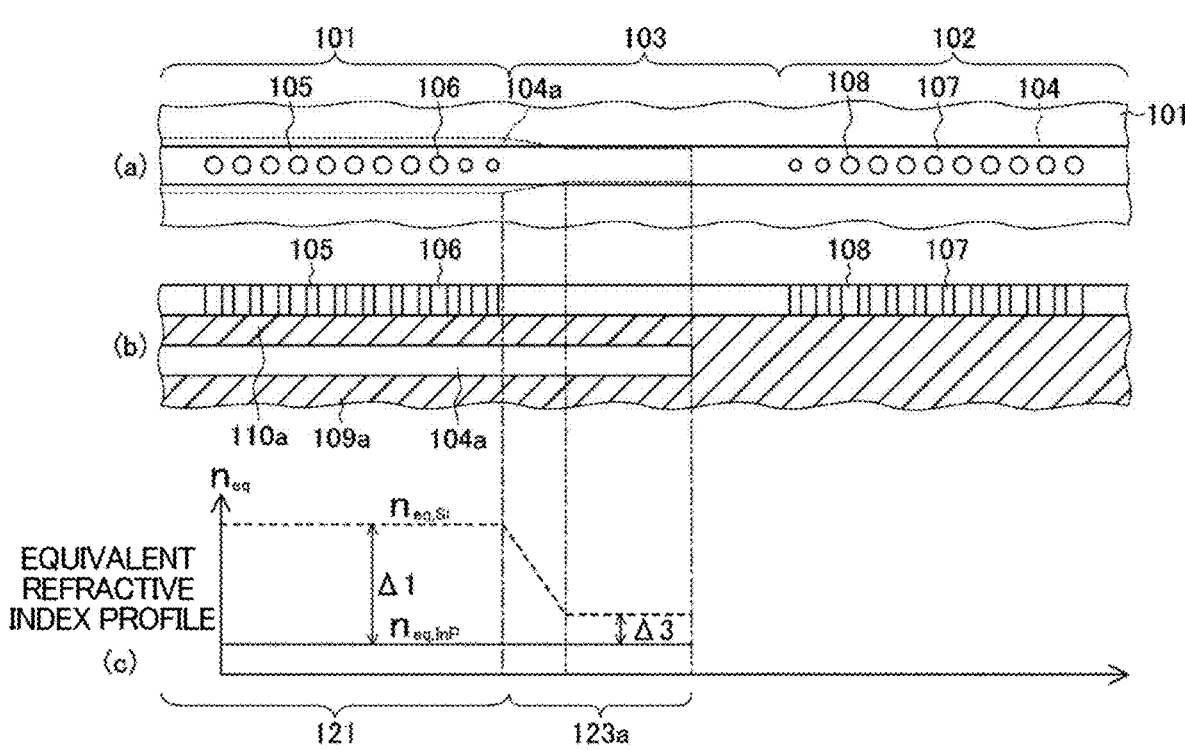
In FIG. 2, (a) is a plan view showing a configuration of an optical device according to a second embodiment of the present invention, (b) is a sectional view thereof, and (c) is a characteristic diagram showing an equivalent refractive index profile of each part thereof.

In the second embodiment, the relationship between differences in equivalent refractive indexes described above can be satisfied by differentiating a diameter of the core 104a in the third region 123 from that of the core 104a in the first region 121 [(c) in FIG. 2]. In the second embodiment, by making the diameter of the core 104a in the third region 123 narrower than the diameter of the core 104a in the first region 121, Δ1 is made larger than Δ3.

Even in the second embodiment, in a similar manner to the first embodiment described above, the optical resonator and the core 104a (the optical waveguide) can be optically coupled to each other at an arbitrary strength while maintaining optical separateness between the optical waveguide and the first reflecting section 101. It should be noted that, with respect to the optical coupling between the core 104a in the third region 123 and the confining section 103, the longer the region (coupling region), the stronger the coupling. However, in the second embodiment, radiation loss due to the core 104a being severed at the middle of the third region 123 occurs.

Third Embodiment

Figure 3:
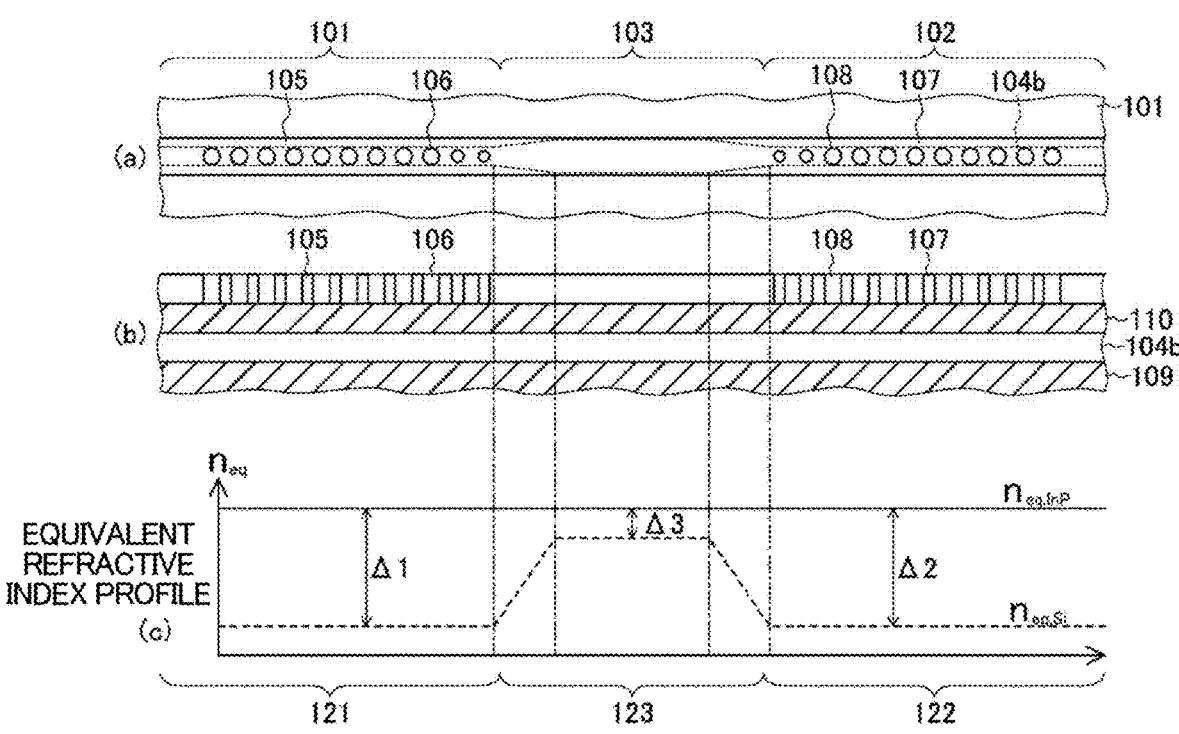
In FIG. 3, (a) is a plan view showing a configuration of an optical device according to a third embodiment of the present invention, (b) is a sectional view thereof, and (c) is a characteristic diagram showing an equivalent refractive index profile of each part thereof.
Figure 4:
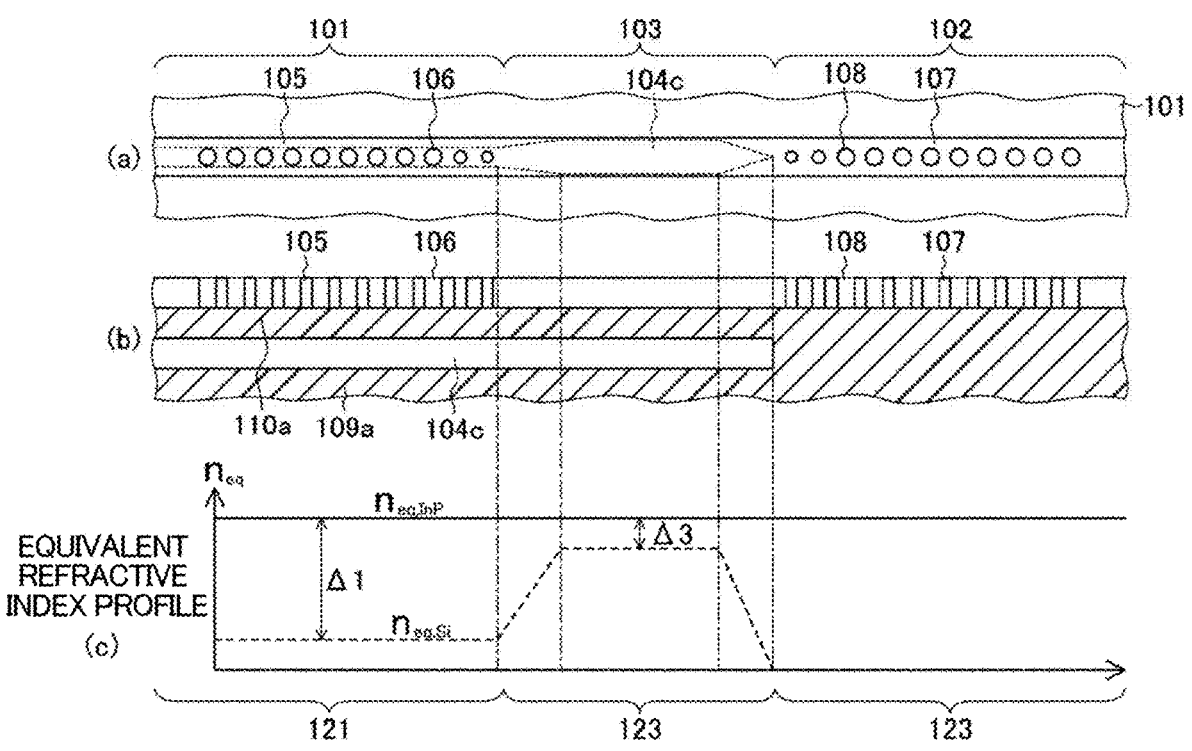
In FIG. 4, (a) is a plan view showing a configuration of an optical device according to a fourth embodiment of the present invention, (b) is a sectional view thereof, and (c) is a characteristic diagram showing an equivalent refractive index profile of each part thereof.

Next, an optical device according to a third embodiment of the present invention will be described with reference to FIG. 3. The optical device first includes: a first reflecting section 101 constituted of a thin-wire waveguide-type one-dimensional photonic crystal; a second reflecting section 102 constituted of a thin-wire waveguide-type one-dimensional photonic crystal; and a confining section 103 sandwiched between the first reflecting section 101 and the second reflecting section 102. These components are similar to those in the first embodiment described earlier.

In addition, the optical device according to the third embodiment includes an optical waveguide constituted of a core 104b that is arranged along the first reflecting section 101, the confining section 103, and the second reflecting section 102. The core 104b is formed on a lower clad layer 109. In addition, an upper clad layer 110 is formed on the lower clad layer 109 so as to cover the core 104b. In the embodiment, an optical resonator constituted of the first base 105, the confining section 103, and the second base 107 described above is formed on the upper clad layer 110. It should be noted that (a) in FIG. 3 is a plan view and (b) in FIG. 3 is a sectional view in a stack direction of the optical waveguide and the optical resonator.

In the embodiment, each of the first reflecting section 101, the confining section 103, and the second reflecting section 102 and the core 104b are separated from each other by the upper clad layer 110. In addition, distances between each of the first reflecting section 101, the confining section 103, and the second reflecting section 102 and the core 104b are set within a range that allows optical coupling to each other.

In addition, even in the optical device according to the third embodiment, a difference Δ1 between an equivalent refractive index of the first reflecting section 101 and an equivalent refractive index of the core 104b in a first region 121 that corresponds to the first reflecting section 101 and a difference Δ2 between an equivalent refractive index of the second reflecting section 102 and an equivalent refractive index of the core 104b in a second region 122 that corresponds to the second reflecting section 102 are set so as to be greater than a difference Δ3 between an equivalent refractive index of the confining section 103 and an equivalent refractive index of the core 104b in a third region 123 that corresponds to the confining section 103.

In the third embodiment, by making the diameter of the core 104 in the third region 123 wider than the diameters of the core 104 in the first region 121 and the core 104 in the second region 122, both Δ1 and Δ2 are made larger than Δ3. In the third embodiment, a width of the core 104 is made narrower than widths of the first reflecting section 101 and the second reflecting section 102 in a plan view and, consequently an optical resonator constituted of the first reflecting section 101, the confining section 103, and the second reflecting section 102 has a smaller equivalent refractive index than that of the optical waveguide constituted of the core 104.

Adopting the configuration of the third embodiment described above similarly enables a configuration to be realized in which the optical waveguide constituted of the core 104b and the confining section 103 are optically coupled to each other but the first and second reflecting sections 101 and 102 and the optical waveguide constituted of the core 104b are not optically coupled to each other.

Fourth Embodiment

Next, an optical device according to a fourth embodiment of the present invention will be described with reference to FIG. 3. The optical device first includes: a first reflecting section 101 constituted of a thin-wire waveguide-type one-dimensional photonic crystal; a second reflecting section 102 constituted of a thin-wire waveguide-type one-dimensional photonic crystal; and a confining section 103 sandwiched between the first reflecting section 101 and the second reflecting section 102. These components are similar to those in the first embodiment described earlier.

In addition, the optical device according to the fourth embodiment includes an optical waveguide constituted of a core 104c that is arranged along the first reflecting section 101, the confining section 103, and the second reflecting section 102. The core 104c is formed on a lower clad layer 109. In addition, an upper clad layer 110 is formed on the lower clad layer 109 so as to cover the core 104c. In the embodiment, an optical resonator constituted of the first base 105, the confining section 103, and the second base 107 described above is formed on the upper clad layer 110. It should be noted that (a) in FIG. 3 is a plan view and (b) in FIG. 3 is a sectional view in a stack direction of the optical waveguide and the optical resonator.

In the embodiment, each of the first reflecting section 101 and the confining section 103 and the core 104c are separated from each other by the upper clad layer 110. In addition, distances between each of the first reflecting section 101 and the confining section 103 and the core 104c are set within a range that allows optical coupling to each other. In the fourth embodiment, the core 104c is formed from a side of the first reflecting section 101 to the middle of the confining section 103. In the fourth embodiment, the core 104c is severed at the middle of the confining section 103.

In addition, in the optical device according to the fourth embodiment, a difference Δ1 between an equivalent refractive index of the first reflecting section 101 and an equivalent refractive index of the core 104c in a first region 121 that corresponds to the first reflecting section 101 is set so as to be greater than a difference Δ3 between an equivalent refractive index of the confining section 103 and an equivalent refractive index of the core 104c in a third region 123 that corresponds to the confining section 103.

In the fourth embodiment, by making the diameter of the core 104c in the third region 123 wider than the diameter of the core 104c in the first region 121, both Δ1 and Δ2 are made larger than Δ3. In the fourth embodiment, a width of the core 104c is made narrower than widths of the first reflecting section 101 and the second reflecting section 102 in a plan view and, consequently an optical resonator constituted of the first reflecting section 101, the confining section 103, and the second reflecting section 102 has a smaller equivalent refractive index than that of the optical waveguide constituted of the core 104c.

While the configuration in which a severed core 104c is used is similar to that of the second embodiment described earlier, in the fourth embodiment, a tip portion of the core 104c on a side of the second reflecting section 102 is tapered toward a tip. As described earlier, although radiation loss due to the core 104c being severed at the middle of the third region 123 occurs, providing the core 104c with a tapered tip portion enables the radiation loss to be reduced. At the tip portion with a tapered shape of the core 104c, since light adiabatically transitions to a side of the optical resonator (the confining section 103), radiation loss can be avoided.

Adopting the configuration of the fourth embodiment described above similarly enables a configuration to be realized in which the optical waveguide constituted of the core 104c and the confining section 103 are optically coupled to each other but the first and second reflecting sections 101 and 102 and the optical waveguide constituted of the core 104c are not optically coupled to each other.

Fifth Embodiment

Figure 5:
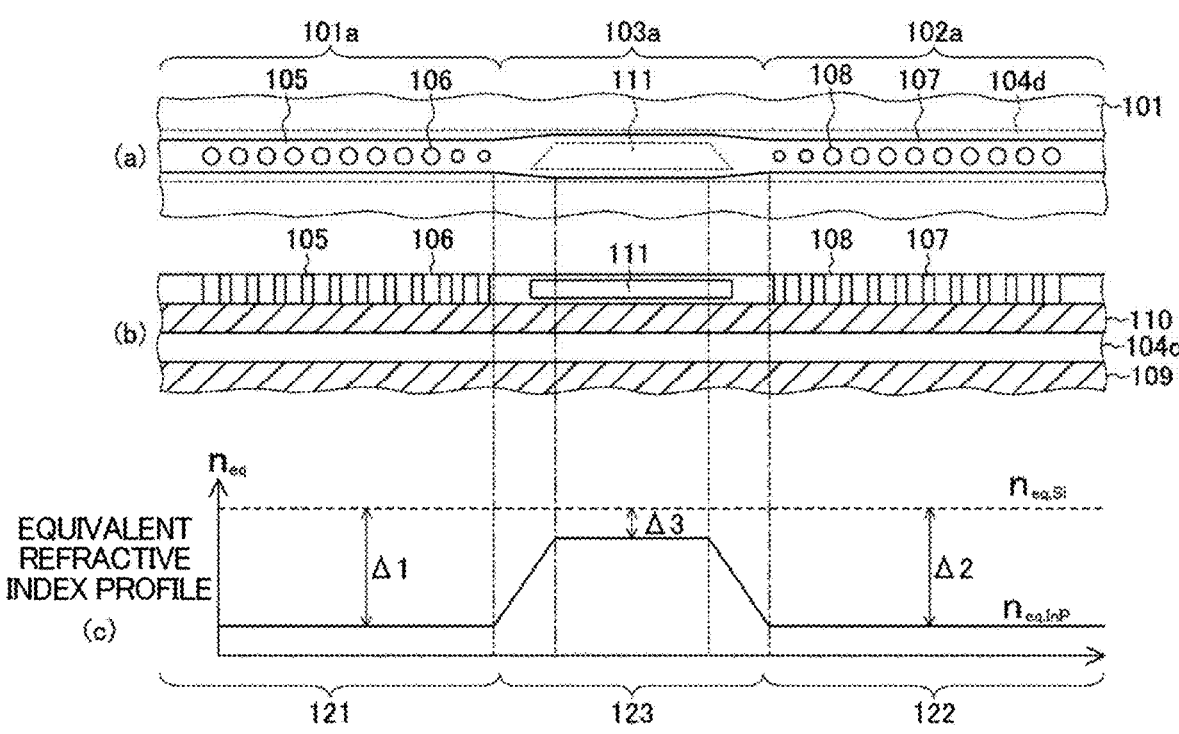
In FIG. 5, (a) is a plan view showing a configuration of an optical device according to a fifth embodiment of the present invention, (b) is a sectional view thereof, and (c) is a characteristic diagram showing an equivalent refractive index profile of each part thereof.

Next, an optical device according to a fifth embodiment of the present invention will be described with reference to FIG. 5. The optical device first includes: a first reflecting section 101a constituted of a thin-wire waveguide-type one-dimensional photonic crystal; a second reflecting section 102a constituted of a thin-wire waveguide-type one-dimensional photonic crystal; and a confining section 103a sandwiched between the first reflecting section 101a and the second reflecting section 102a. These components are similar to those in the first embodiment described earlier.

In addition, the optical device according to the fifth embodiment includes an optical waveguide constituted of a core 104d that is arranged along the first reflecting section 101a, the confining section 103a, and the second reflecting section 102a. The core 104d is formed on a lower clad layer 109. In addition, an upper clad layer 110 is formed on the lower clad layer 109 so as to cover the core 104d. In the embodiment, an optical resonator constituted of the first base 105, the confining section 103a, and the second base 107 described above is formed on the upper clad layer 110. It should be noted that (a) in FIG. 5 is a plan view and (b) in FIG. 5 is a sectional view in a stack direction of the optical waveguide and the optical resonator.

In the fifth embodiment, each of the first reflecting section 101a, the confining section 103a, and the second reflecting section 102a and the core 104d are separated from each other by the upper clad layer 110. In addition, distances between each of the first reflecting section 101a, the confining section 103a, and the second reflecting section 102a and the core 104d are set within a range that allows optical coupling to each other.

In addition, in the optical device according to the fifth embodiment, a difference Δ1 between an equivalent refractive index of the first reflecting section 101a and an equivalent refractive index of the core 104d in a first region 121 that corresponds to the first reflecting section 101a and a difference Δ2 between an equivalent refractive index of the second reflecting section 102a and an equivalent refractive index of the core 104d in a second region 122 that corresponds to the second reflecting section 102a are set so as to be greater than a difference Δ3 between an equivalent refractive index of the confining section 103a and an equivalent refractive index of the core 104d in a third region 123 that corresponds to the confining section 103a.

In the fifth embodiment, a width in a plan view of the confining section 103a is differentiated from a width in a plan view of the first reflecting section 101a and a width in a plan view of the second reflecting section 102a. The width in a plan view of the confining section 103a is made larger than the width in a plan view of the first reflecting section 101a and the width in a plan view of the second reflecting section 102a. In addition, in the fifth embodiment, the width in a plan view of the confining section 103a is gradually varied to the first reflecting section 101a and the second reflecting section 102a. Furthermore, in the fifth embodiment, an embedded structure 111 made of a material with a higher refractive index than the confining section 103a is embedded in the confining section 103a.

As described above, even when the width in a plan view of the confining section 103a is differentiated from a width in a plan view of the first reflecting section 101a and a width in a plan view of the second reflecting section 102a, Δ1 and Δ2 can be made larger as compared to Δ3. In addition, even adopting a structure in which the embedded structure 111 is embedded in the confining section 103a enables Δ1 and Δ2 to be made larger as compared to Δ3.

It should be noted that, in a plan view, an end of the embedded structure 111 on a side of the first reflecting section 101a has a shape that tapers toward the side of the first reflecting section 101a. In addition, in a plan view, an end of the embedded structure 111 on a side of the second reflecting section 102a has a shape that tapers toward the side of the second reflecting section 102a. Adopting such a configuration enables loss due to reflection at the ends of the embedded structure 111 to be reduced and, at the same time, enables modes to be adiabatically varied at the ends.

In the fifth embodiment, an optical resonator constituted of the first reflecting section 101a, the confining section 103a, and the second reflecting section 102a has a smaller equivalent refractive index than that of the optical waveguide constituted of the core 104d.

Adopting the configuration of the fifth embodiment described above similarly enables a configuration to be realized in which the optical waveguide constituted of the core 104d and the confining section 103a are optically coupled to each other but the first and second reflecting sections 101a and 102a and the optical waveguide constituted of the core 104d are not optically coupled to each other.

Sixth Embodiment

Next, an optical device according to a sixth embodiment of the present invention will be described with reference to FIG. 6. The optical device first includes: a first reflecting section 101b constituted of a thin-wire waveguide-type one-dimensional photonic crystal; a second reflecting section 102b constituted of a thin-wire waveguide-type one-dimensional photonic crystal; and a confining section 103b sandwiched between the first reflecting section 101b and the second reflecting section 102b. These components are similar to those in the first embodiment described earlier.

In addition, the optical device according to the sixth embodiment includes an optical waveguide constituted of a core 104e that is arranged along the first reflecting section 101b, the confining section 103b, and the second reflecting section 102b. The core 104e is formed on a lower clad layer 109. In addition, an upper clad layer 110 is formed on the lower clad layer 109 so as to cover the core 104e. In the embodiment, an optical resonator constituted of the first base 105, the confining section 103b, and the second base 107 described above is formed on the upper clad layer 110.

Figure 6:
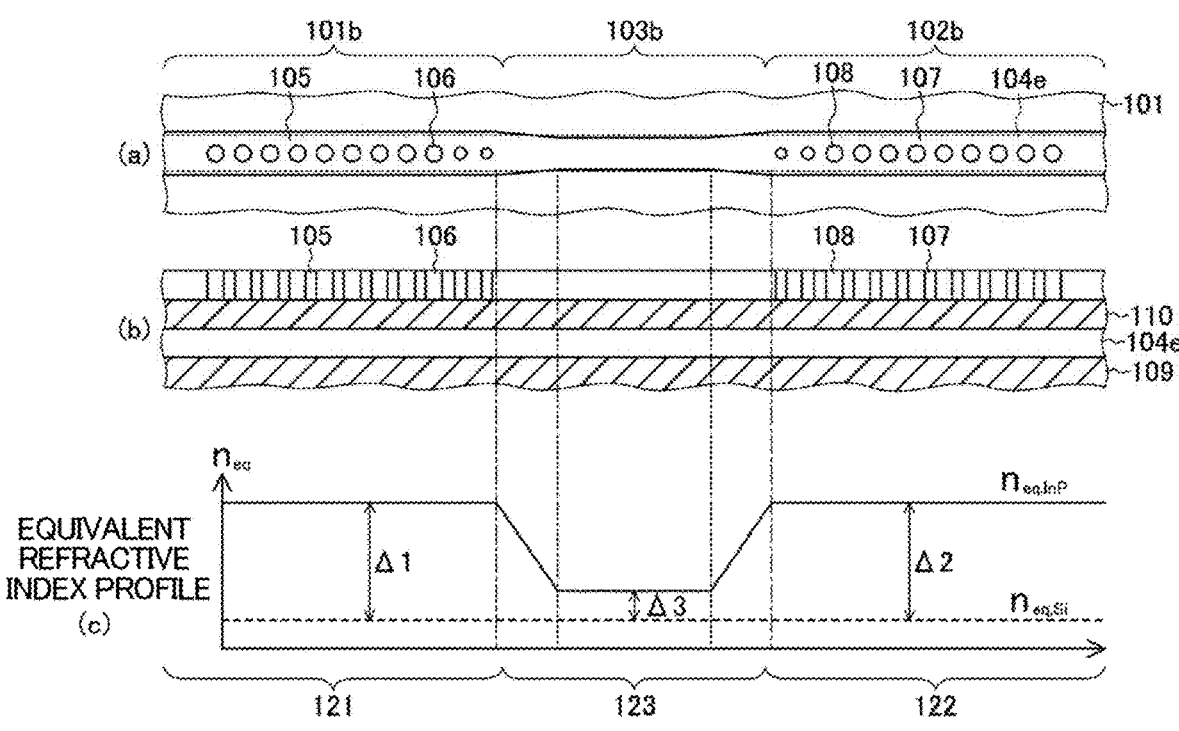
In FIG. 6, (a) is a plan view showing a configuration of an optical device according to a sixth embodiment of the present invention, (b) is a sectional view thereof, and (c) is a characteristic diagram showing an equivalent refractive index profile of each part thereof.

It should be noted that (a) in FIG. 6 is a plan view and (b) in FIG. 6 is a sectional view in a stack direction of the optical waveguide and the optical resonator.

In the sixth embodiment, each of the first reflecting section 101*b*, the confining section 103*b*, and the second reflecting section 102*b* and the core 104*e* are separated from each other by the upper clad layer 110. In addition, distances between each of the first reflecting section 101*b*, the confining section 103*b*, and the second reflecting section 102*b* and the core 104*e* are set within a range that allows optical coupling to each other.

In addition, in the optical device according to the sixth embodiment, a difference Δ1 between an equivalent refractive index of the first reflecting section 101*b* and an equivalent refractive index of the core 104*e* in a first region 121 that corresponds to the first reflecting section 101*b* and a difference Δ2 between an equivalent refractive index of the second reflecting section 102*b* and an equivalent refractive index of the core 104*e* in a second region 122 that corresponds to the second reflecting section 102*b* are set so as to be greater than a difference Δ3 between an equivalent refractive index of the confining section 103*b* and an equivalent refractive index of the core 104*e* in a third region 123 that corresponds to the confining section 103*b*.

In the sixth embodiment, a width in a plan view of the confining section 103*b* is differentiated from a width in a plan view of the first reflecting section 101*b* and a width in a plan view of the second reflecting section 102*b*. The width in a plan view of the confining section 103*b* is made smaller than the width in a plan view of the first reflecting section 101*b* and the width in a plan view of the second reflecting section 102*b*. In addition, in the sixth embodiment, the width in a plan view of the confining section 103*b* is gradually varied to the first reflecting section 101*b* and the second reflecting section 102*b*.

As described above, even when the width in a plan view of the confining section 103*b* is differentiated from a width in a plan view of the first reflecting section 101*b* and a width in a plan view of the second reflecting section 102*b*, Δ1 and Δ2 can be made larger as compared to Δ3.

In the sixth embodiment, an optical resonator constituted of the first reflecting section 101*b*, the confining section 103*b*, and the second reflecting section 102*b* has a larger equivalent refractive index than that of the optical waveguide constituted of the core 104*e*.

Adopting the configuration of the sixth embodiment described above similarly enables a configuration to be realized in which the optical waveguide constituted of the core 104*e* and the confining section 103*b* are optically coupled to each other but the first and second reflecting sections 101*b* and 102*b* and the optical waveguide constituted of the core 104*e* are not optically coupled to each other.

Next, a result of a calculation of reflection characteristics of an optical resonator in an optical device that combines the optical resonator and an optical waveguide with each other will be described. First, an optical device to which the configuration of embodiments of the present invention has not been applied will be described. With respect to a Fabry-Perot optical resonator constituted of a first reflecting section, a confining section, and a second reflecting section and an optical waveguide constituted of an Si core which is arranged along the optical resonator, reflection characteristics were calculated while varying a distance between the optical resonator and the Si core.

Figure 7A:
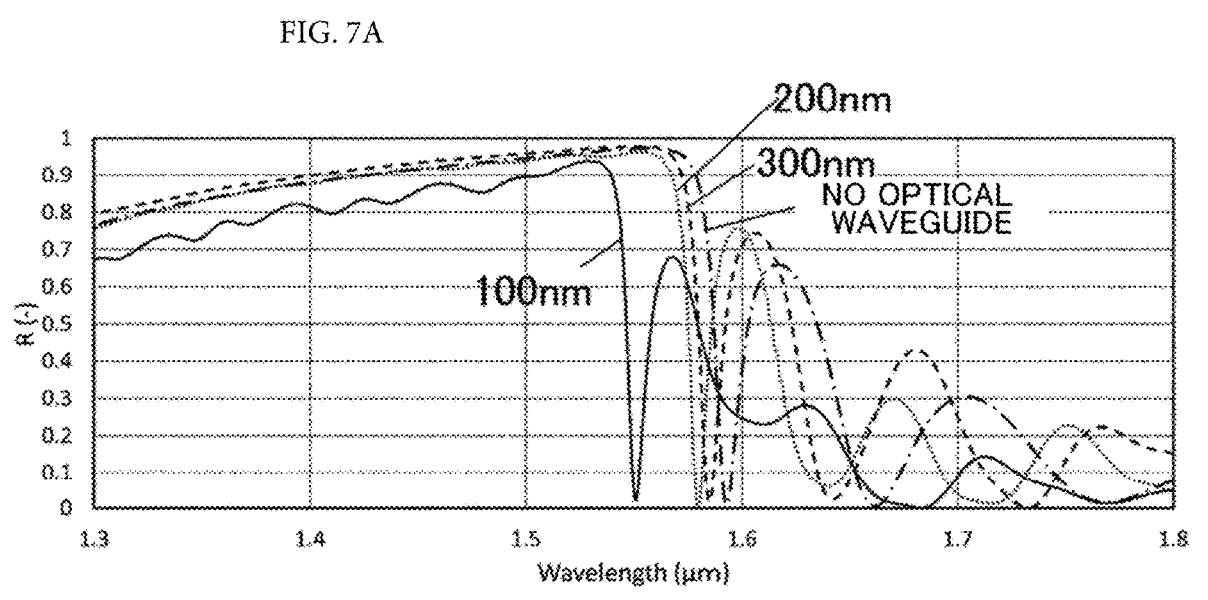
Figure 7B:
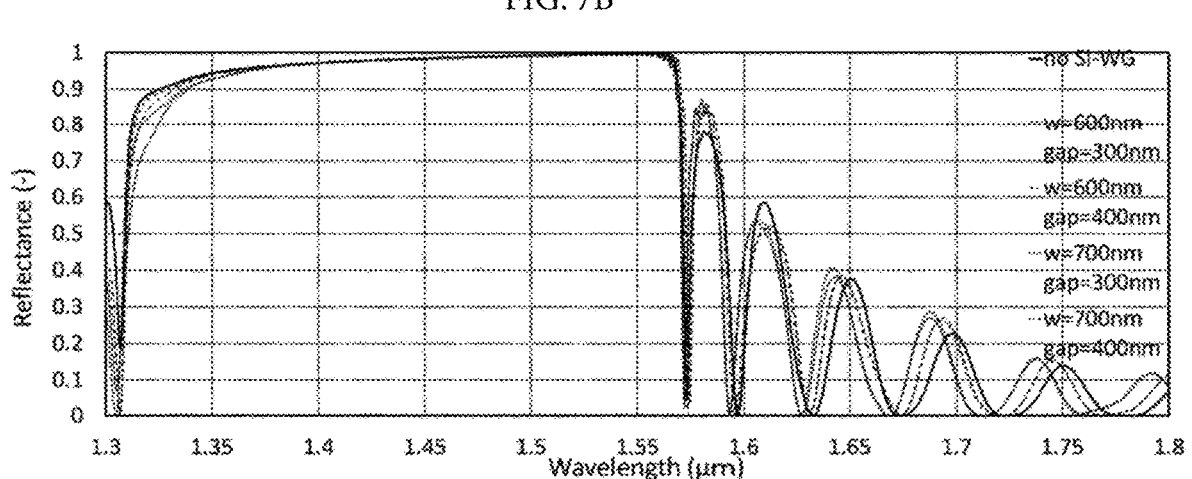
FIG. 7B is a characteristic diagram showing a result of a calculation of reflection characteristics of an optical resonator in an optical device according to the present invention which combines the optical resonator and an optical waveguide with each other.

In the optical device to which the configuration of embodiments of the present invention has not been applied, as shown in FIG. 7A, reflection characteristics clearly decline as the distance between the optical resonator and the Si core is made narrower and the coupling between the two becomes stronger. By comparison, in the optical device according to the embodiments, as shown in FIG. 7B, even when the width of the Si core is set to 600 nm to 700 nm and the distance between the optical resonator and the Si core is set to 300 nm to 400 nm (these values are sufficient to strongly couple the confining section of the optical resonator and the Si core to each other), reflection characteristics comparable to a case where the Si core is absent are obtained and a significant decline in reflection characteristics due to arranging the Si core is not confirmed.

Figure 8:
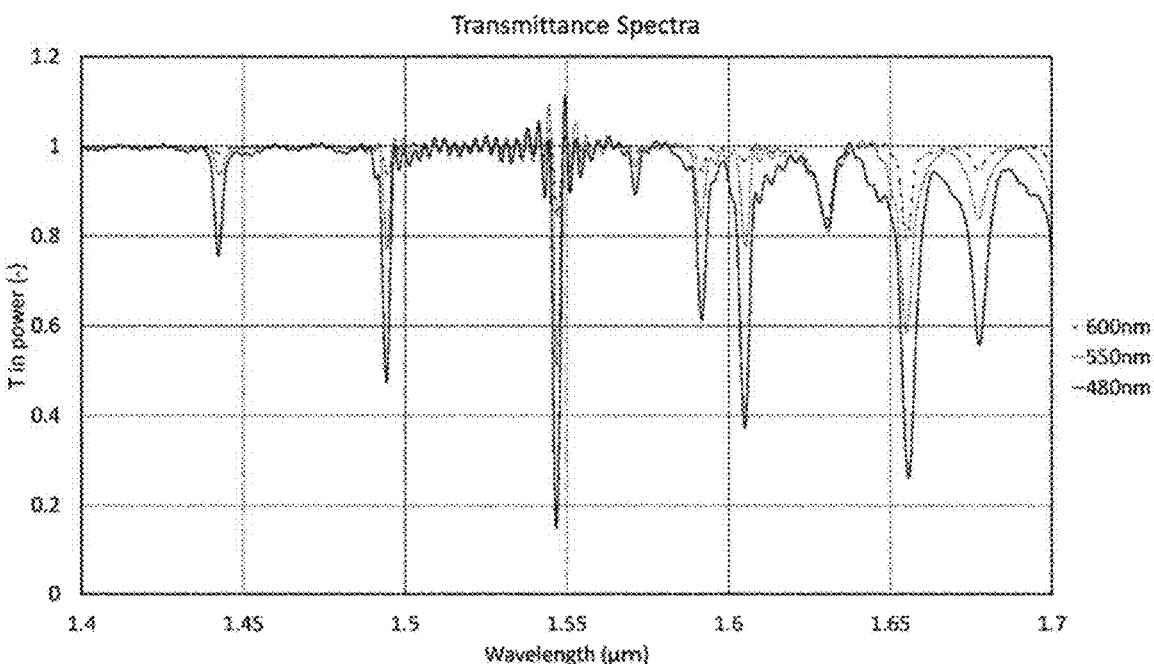
FIG. 8 is a characteristic diagram showing a result of a calculation, using FDTD, of a transmission spectrum in the optical device according to the first embodiment.

Next, FIG. 8 shows a result of a calculation of, using FDTD (Finite Difference Time Domain), a transmission spectrum in the optical device according to the first embodiment. In this calculation, first, the core 104 in the first region 121 and the second region 122 is given a sectional shape with a width in a plan view of 600 nm and a thickness of 220 nm. In addition, lengths of the first adiabatic region 124 and the second adiabatic region 125 are respectively set to 800 nm. Furthermore, in the third region 123, the width in a plan view in the sectional shape of the core 104 in a center portion of the third region 123 is varied from 480 nm to 550 nm to 600 nm. The thickness of the core 104 is commonly set to 220 nm. In addition, each clad layer is made of silicon oxide, the core 104 is made of silicon, and the optical resonator constituted of the first base 105, the confining section 103, and the second base 107 is made of InP. Furthermore, the distance between the optical resonator and the core 104 is set to 400 nm.

FIG. 8 reveals that, the narrower the width of the core 104 in the third region 123, the stronger the coupling between the optical resonator and the optical waveguide constituted of the core 104. Therefore, the strength of the optical coupling between the optical resonator and the optical waveguide constituted of the core 104 can be controlled according to a variation amount of a diameter of the core 104 in the third region relative to the first region 121 and the second region 122.

Next, other embodiments of the present invention will be described. A plurality of optical devices with respectively different resonator lengths can be used by optically connecting (optically coupling) the optical devices in series. For example, a first optical device, a second optical device, a third optical device, and a fourth optical device are connected in series. For example, a resonator length (a length of the confining section 103) of the second optical device is longer than that of the first optical device by 20 nm, the resonator length of the third optical device is longer than that of the second optical device by 20 nm, and the resonator length of the fourth optical device is longer than that of the third optical device by 20 nm. In addition, in each optical device, a width of an Si core in regions corresponding to the first reflecting section and the second reflecting section is set to 600 nm and the width of the Si core in a region corresponding to the confining section is set to 550 nm. Furthermore, in each optical device, a distance between the optical device and the Si core is set to 400 nm.

Figure 9:
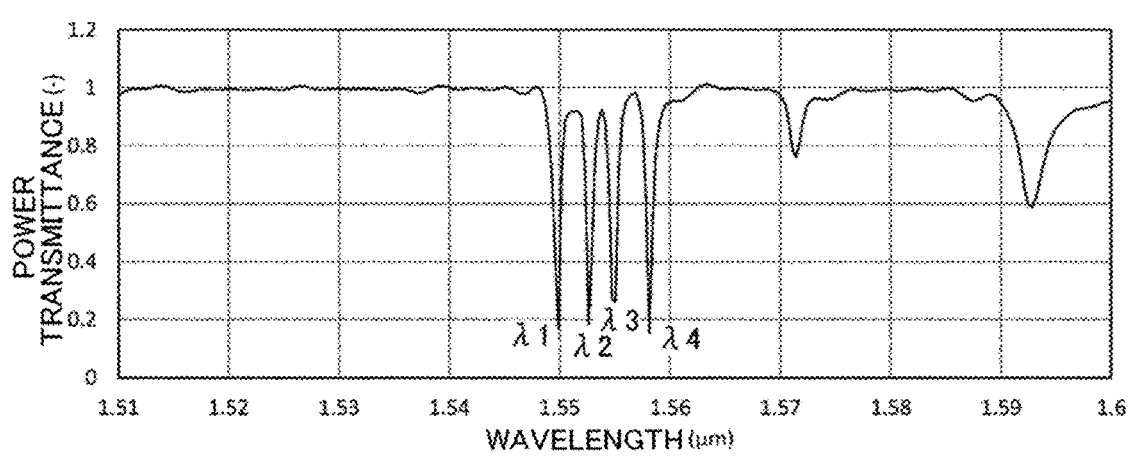
FIG. 9 is a characteristic diagram showing, in a configuration in which a first optical device, a second optical device, a third optical device, and a fourth optical device are connected in series, a result of a measurement of a spectrum of broadband light incident from a side of the first optical device and emitted from a side of the fourth optical device.

FIG. 9 shows, in the series configuration described above, a result of a measurement of a spectrum of broadband light incident from a side of the first optical device and emitted from a side of the fourth optical device. With respect to a resonator length shift of 20 nm, a shift of each of resonance wavelengths λ1, λ2, λ3, and λ4 is around 3 nm.

Figure 10:
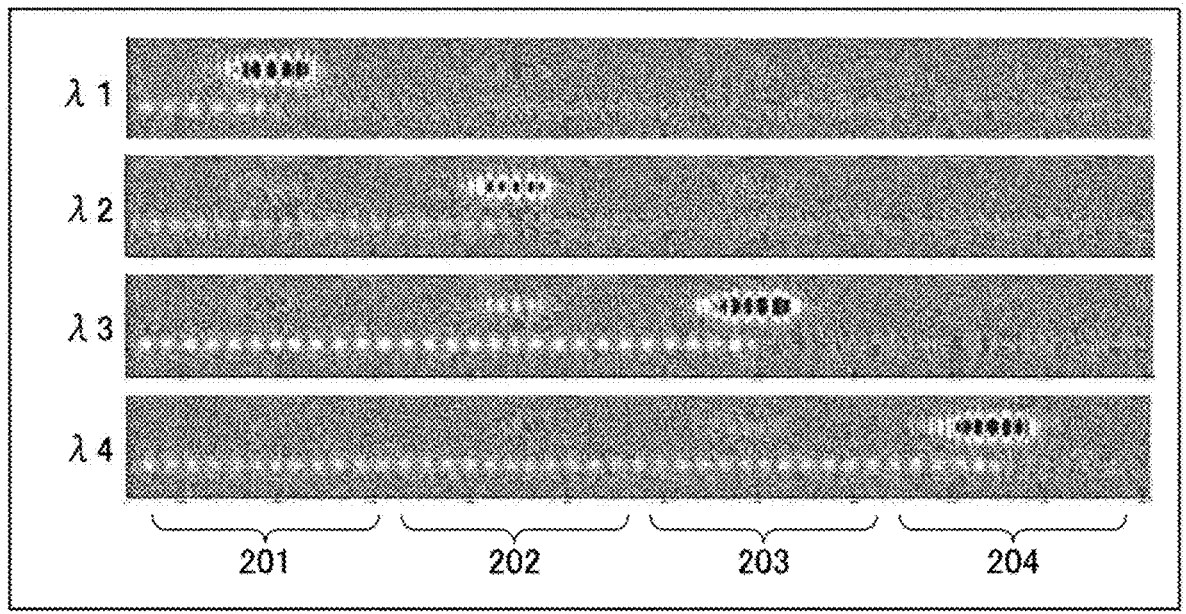
FIG. 10 is a distribution diagram showing, in a configuration in which a first optical device, a second optical device, a third optical device, and a fourth optical device are connected in series, a distribution of modes of light in each optical device.

In addition, FIG. 10 shows a distribution of modes of light in each optical device in the series configuration described above. Light of λ1 is distributed in a center portion (the confining section) of the first optical device 201. In addition, light of λ2 is distributed in a center portion (the confining section) of the second optical device 202. In addition, light of λ3 is distributed in a center portion (the confining section) of the third optical device 203. In addition, light of λ4 is distributed in a center portion (the confining section) of the fourth optical device 204.

As described above, by connecting a plurality of optical devices in series, Wavelength Division Multiplexing (WDM) can be realized. Accordingly, for example, when the present optical device is operated as a laser diode, a WDM light source that does not require a multiplexer can be realized. In addition, for example, when the present optical device is operated as a photodiode, a WDM photoreceptor that does not require a demultiplexer can be realized.

As described above, according to embodiments of the present invention, since a difference in equivalent refractive indexes between a reflecting section which constitutes a resonator and a core is made greater than a difference in equivalent refractive indexes between a confining section and the core, a resonator using a one-dimensional photonic crystal as a reflecting section and an optical waveguide can be optically coupled to each other without degrading resonance characteristics.

It is to be understood that the present invention is not limited to the embodiments described above and that many modifications and combinations will obviously occur to those with ordinary skill in the art without departing from the technical scope of the present invention.

REFERENCE SIGNS LIST

101 First reflecting section
102 Second reflecting section
103 Confining section
104 Core
105 First base
106 First lattice element
107 Second base
108 Second lattice element
109 Lower clad layer
110 Upper clad layer
121 First region
122 Second region
123 Third region
124 First adiabatic region
125 Second adiabatic region.

The invention claimed is:
1. An optical device, comprising:
a Fabry-Perot optical resonator including:
a first reflecting section constituted of a first thin-wire waveguide-type one-dimensional photonic crystal;
a second reflecting section constituted of a second thin-wire waveguide-type one-dimensional photonic crystal; and
a confining section between the first reflecting section and the second reflecting section; and
a core arranged along the first reflecting section, the confining section, and the second reflecting section,
wherein the core is separated from the first reflecting section, the confining section, and the second reflecting section, and a distance between the core and the confining section is set within a range that allows optical coupling to each other, and
wherein a difference between an equivalent refractive index of the first reflecting section and an equivalent refractive index of the core in a first region that corresponds to the first reflecting section or a difference between an equivalent refractive index of the second reflecting section and an equivalent refractive index of the core in a second region that corresponds to the second reflecting section is greater than a difference between an equivalent refractive index of the confining section and an equivalent refractive index of the core in a third region that corresponds to the confining section.
2. The optical device according to claim 1, wherein:
a diameter of the core in the third region differs from a diameter of the core in the first region or a diameter of the core in the second region.
3. The optical device according to claim 2, wherein:
the diameter of the core gradually changes from the third region towards the first region or the second region.
4. The optical device according to claim 1, wherein:
a width of the confining section in a plan view differs from a width of the first reflecting section in the plan view.
5. The optical device according to claim 4, wherein:
the width of the confining section in the plan view gradually changes towards the first reflecting section.
6. The optical device according to claim 4, wherein:
the width of the confining section in the plan view differs from a width of the second reflecting section in the plan view.
7. The optical device according to claim 4, wherein:
the width of the confining section in the plan view gradually changes towards the second reflecting section.
8. The optical device according to claim 1, further comprising:
a light-emitting device arranged in the confining section.
9. The optical device according to claim 8, wherein the light-emitting device is a light-emitting diode.
10. The optical device according to claim 1, further comprising:
an active layer arranged in the confining section; and
a current injection structure configured to inject a current into the confining section.
11. The optical device according to claim 10, wherein:
the current injection structure includes an n-type semiconductor layer and a p-type semiconductor layer arranged with the confining section interposed therebetween.
12. The optical device according to claim 1, wherein:
a first end of the confining section is coupled to the first reflecting section, and a second end of the confining section is coupled to the second reflecting section.
13. An optical device, comprising:
a Fabry-Perot optical resonator including:
a first reflecting section constituted of a first photonic crystal;
a second reflecting section constituted of a second photonic crystal; and
a confining section between the first reflecting section and the second reflecting section; and
a core arranged along the first reflecting section, the confining section, and the second reflecting section,
wherein the core is separated from the first reflecting section, the confining section, and the second reflecting section, and wherein a difference between an equivalent refractive index of the first reflecting section and an equivalent refractive index of the core in a first region that corresponds to the first reflecting section is greater than a difference between an equivalent refractive index of the confining section and an equivalent refractive index of the core in a second region that corresponds to the confining section.

14. The optical device according to claim 13, wherein:
a diameter of the core in the second region differs from a diameter of the core in the first region.

15. The optical device according to claim 14, wherein:
the diameter of the core gradually changes from the second region towards the first region.

16. The optical device according to claim 13, wherein:
a width of the confining section in a plan view differs from a width of the first reflecting section in the plan view.

17. The optical device according to claim 16, wherein:
the width of the confining section in the plan view gradually changes towards the first reflecting section.

18. The optical device according to claim 13, further comprising:
a light-emitting device arranged in the confining section.

19. The optical device according to claim 18, wherein the light-emitting device is a light-emitting diode.

20. The optical device according to claim 13, further comprising:
an active layer arranged in the confining section; and
a current injection structure configured to inject a current into the confining section.

* * * * *